United States Patent [19]

Kawakami et al.

[11] Patent Number: 5,145,691
[45] Date of Patent: Sep. 8, 1992

[54] APPARATUS FOR PACKING FILLER INTO THROUGH-HOLES OR THE LIKE IN A PRINTED CIRCUIT BOARD

[75] Inventors: Shin Kawakami; Satoshi Haruyama; Hirotaka Okonogi, all of Saitama, Japan

[73] Assignee: Nippon CMK Corp., Japan

[21] Appl. No.: 674,680

[22] Filed: Mar. 22, 1991

[30] Foreign Application Priority Data

Jul. 18, 1990 [JP] Japan .................................. 2-190155

[51] Int. Cl.$^5$ ..................... B29C 47/08; B29C 47/10
[52] U.S. Cl. .................................. 425/110; 118/300; 118/301; 118/504; 425/97; 425/447
[58] Field of Search ................... 425/97, 110, 447; 264/104, 105, 267; 118/301, 300, 504, 305, 306, 317

[56] References Cited

U.S. PATENT DOCUMENTS

| | | | |
|---|---|---|---|
| 2,981,981 | 5/1961 | Luhn | 264/104 |
| 3,102,053 | 8/1963 | Way et al. | 118/301 |
| 3,492,381 | 1/1970 | Rhyne | 264/267 |
| 4,008,300 | 2/1977 | Ponn | 264/104 |
| 4,323,593 | 4/1982 | Tsunashima | 427/97 |
| 4,604,799 | 8/1986 | Gurol | 264/104 |
| 4,728,568 | 3/1988 | Sasada et al. | 427/97 |

FOREIGN PATENT DOCUMENTS

| | | | |
|---|---|---|---|
| 3509626 | 9/1986 | Fed. Rep. of Germany | 425/97 |
| 865978 | 4/1961 | United Kingdom | 425/110 |

Primary Examiner—Willard Hoag
Attorney, Agent, or Firm—Bruce L. Adams; Van C. Wilks

[57] ABSTRACT

An apparatus for packing a filler of conductive material into through-holes in a printed circuit board comprises a packing nozzle, an mask and a covering plate. The packing nozzle delivers a filler of conductive material through a delivery opening, and a delivery valve is mounted at the delivery opening. A manipulator is provided on the upper part of the nozzle for manipulating the delivery valve, and a nozzle tip is attachable to and detachable from the delivery opening. The mask has packing holes disposed in positions corresponding to those of the through-holes in the printed circuit board, and the mask is mountable on the upper side of the printed circuit board. The covering plate has escape holes in positions corresponding to those of through-holes in the printed circuit board, and the covering plate is disposable on the lower side of the printed circuit board. A squeegee may be provided on the lower part of the nozzle. The apparatus make it possible to attain a uniform and stable packing of filler into the through-holes without being affected by the thickness of the printed circuit board, the size of the through-hole diameter, or the fluidity of the filler.

11 Claims, 3 Drawing Sheets

APPARATUS FOR PACKING FILLER INTO THROUGH-HOLES OR THE LIKE IN A PRINTED CIRCUIT BOARD

BACKGROUND OF THE INVENTION

The present invention relates to an apparatus for packing filler into the through-holes or the like on a printed circuit board.

There are two conventional types of apparatus for packing filler of conductive material into through-holes on a printed circuit board. In one type, the conductive material is attached to a packing pin, and then is transferred to the inner wall of a through-hole from an outer peripheral surface of said packing pin by inserting said pin into a through-hole that has been bored in the printed circuit board. In the other, the conductive material is packed into each through-hole on the printed circuit board through a printing silk screen that has open-work corresponding to the circuit design of the printed circuit board.

The former packing apparatus, which uses said pin system, requires a plurality of repeated operations to attach conductive material to the packing pins and then to insert those pins into their respective through-holes on the printed board in order to embed the material inside the through-holes. This method is inefficient and complicated because it is difficult to attach enough conductive material to each pin.

Moreover, in this method the conductive material must be heated for curing each time it is transferred to the inner wall of a through-hole from a packing pin. This inflicts much thermal damage on the printed circuit board's structural material and significantly deteriorates the board's dimensional stability.

Furthermore, when a printed circuit board has many through-holes bored, many pins must be used at once. Since pin-arranging design limitations make it usually impossible to use more than 1,000 pins, the area of a printed circuit board is limited in many cases to 300 mm$^2$.

It is also difficult to mass produce, install, and operate so many pin jigs whose pins must be arranged to correspond to the through-holes of a printed circuit board.

When the silk-screen method is used as in the latter packing apparatus, the squeegee's pressure against the screen is not uniform. In addition, under the usual squeegee pressure, it is difficult to pack conductive material into each through-hole on the printed circuit board, and impossible to do so if the printed circuit board is thick or the diameter of the through-hole is small. The present technical standard for packing conductive material requires a minimum through diameter hole of 0.7 mm when the board thickness is 1.6 mm.

In the two conventional types of apparatus, the poor fluidity of conductive material has a large effect on the uniformity of packed material and tends to complicate operations. The usual countermeasure is to add solvent to the conductive material to make its fluidity more uniform. This remedial measure, however, causes gas bubbles to accumulate and cracks to develop in the through-holes as a result of heat generation and consequent solvent evaporation during the hardening of conductive material after being packed. This results in the possible failure of conductivity and difficulty in removing the solvent.

Thus, a higher-alcohol-based solvent with a high boiling point, and thereby a resistance to vaporization, is often used to retain desirable fluidity for a long duration. But this causes another difficulty: the complete removal of such a solvent without generation of bubbles requires the vaporization of the solvent over a long period of time and at a sufficiently low temperature to prevent unremoved solvent from decreasing the reliability of the printed circuit board.

SUMMARY OF THE INVENTION

An object of the present invention is to eliminate the above disadvantage of the conventional packing apparatuses and to solve the above problems.

Another object of the present invention is to provide an apparatus for packing filler of conductive material or the like uniformly into through-holes in a printed circuit board without being affected by the thickness of the printed circuit board, the number of through-holes, their diameter, or the like.

According to the present invention, there is provided an apparatus for packing filler of conductive material into through-holes or the like in a printed circuit board. A packing nozzle having a packing means is provided for delivering filler of conductive material or the like through a delivery opening integrated with said packing means. A delivery valve is mounted to said delivery opening. A manipulating means is provided on the upper part of said nozzle for manipulating said delivery valve, and a nozzle tip is attached to and detachable from said delivery opening. The present invention also provides a mask having packing holes disposed in positions corresponding to those of through-holes on said printed circuit board, this mask is mountable on the upper side of said printed circuit board. A covering plate is also provided having escape holes in positions corresponding to those of through-holes on said printed circuit board, this covering plate is disposable on the lower side of said printed circuit board.

According to the present invention there is also provided another embodiment of an apparatus for packing filler of conductive material into through-holes or the like in a printed circuit board. A packing nozzle is provided having a packing means for delivering filler of conductive material or the like through a delivery opening integrated with said packing means. A delivery valve is mounted to said delivery opening. A manipulating means is provided on the upper part of said nozzle for manipulating said delivery valve. A nozzle tip is attachable to and detachable from said delivery opening, and a squeegee is provided on the lower part of said nozzle. A mask having packing holes disposed in positions corresponding to those of through-holes on said printed circuit board is provided and said mask mounted on the upper side of said printed circuit board. This embodiment also provides a covering plate having escape holes in positions corresponding to those of through-holes on said printed circuit board, said covering plate is disposable on the lower side of said printed circuit board.

According to the above construction of the apparatus for packing filler of conductive material into through-holes or the like in a printed circuit board, a uniform and stable packing of filler into through-holes, or the like is attained without being affected by the thickness of the printed circuit board, the size of the through-hole diameter, or the fluidity of the filler.

These objects and other objects, features, aspects, and advantages of the present invention will become more

DETAILED DESCRIPTION OF THE PREFERRED EMBODIMENTS

First Embodiment

Figure 1:
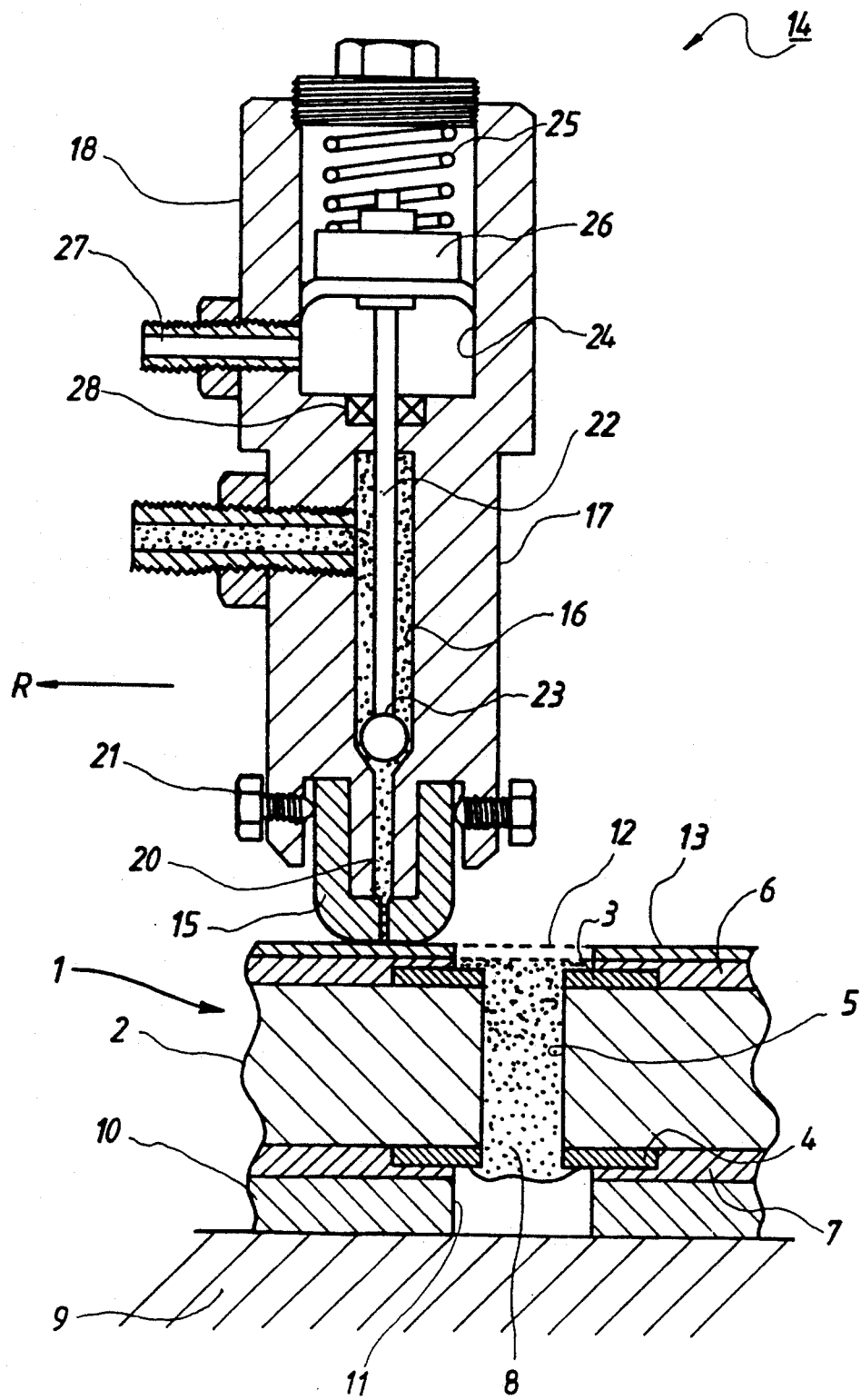
FIGS. 1 through 3 are illustrations showing the sectional views of first through third embodiments of the present invention.

FIG. 1 is an illustration showing a sectional view of an apparatus of a first embodiment of the present invention.

Referring to FIG. 1, the reference numeral 1 indicates a printed circuit board having a construction such that circuit patterns (not shown) in the form of a conductor circuit are disposed on both sides of a substrate 2 made of an insulator. Junction lands 3 and 4 are arranged so as to electrically connect the circuit patterns on the two sides of the substrate, and through-holes 5 are produced by punching or drilling between the two junction lands 3 and 4. The circuit patterns on both sides of the substrate 2 are coated with under-resist (or solder resist) 6 and 7.

Each of the through-holes 5 on the printed circuit board 1 is packed with conductive material 8 after the printed circuit board 1 is mounted on the top side of a covering plate 10, which has been laid on a frame 9. In this case, the mounting is performed by aligning an escape hole 11 of the covering plate 10 with the through-hole 5 on the printed circuit board 1 as shown in FIG. 1.

Furthermore, a mask 13 provided with packing through-holes 12 is mounted on the top side of the printed circuit board 1 in a manner such that the packing through-holes 12 will match the corresponding through-holes 5 on the board 1.

Then, conductive material 8 is delivered from a nozzle end 15 of the horizontally-mobile packing nozzle 14 installed above the upper side of the mask 13. At the same time, the conductive material 8 is packed into the through-hole 5 on the printed circuit board 1 through the packing through-hole 12 of the mask 13.

The packing nozzle 14 comprises a main nozzle body 17, a packing means 16 for packing conductive material 8, and a manipulating means 18 for manipulating a delivery valve 23. The manipulating means 18 is mounted to the upper part of the packing means 16 within the main body 17.

The nozzle end 15 is attached with screws 21 to a delivery opening 20 of the packing means 16, to which conductive material 8 is supplied from a supplying means (not shown) via a supply hole 19.

The delivery opening 20 of the packing means 16 is mounted with the delivery valve 23 via a manipulation rod 22. The upper end of the manipulation rod 22 is connected to a manipulation valve 26, which is elastically provided by means of a spring 25 in a manipulation room 24 installed on the upper part of the main nozzle body 17.

A pneumatic manipulation source (not shown) is connected, via both a connecting port 27 and a controller (not shown) for controlling the pneumatic manipulation source, to the manipulation means 18 in the manipulation room 24. The reference numeral 28 is a slide bearing associated with the manipulation rod 22.

When the above-described packing nozzle 14 is used to pack conductive material 8 into the through-hole 5 via the mask 13, the nozzle end 15 is abutted against the top surface of the mask 13 via a manipulation means (not shown) for manipulating the packing nozzle 14 and then the packing nozzle 14 is slid in the horizontal direction.

During this horizontal shift, the nozzle scans the printed circuit board 1 to find the position that corresponds to the through-hole 5 and stops in order to raise the manipulation rod 22 of the manipulation means 18 against the resilient force of the spring 25 and to open the delivery opening 20 by actuating the delivery valve 23. Then conductive material 8 pressurized in the supply source is sent through the connecting port 19 to the inside of the packing means 16, spouted from the nozzle end 15, and packed into the through-hole 5 via the packing hole 12 of the mask 13.

Although conductive material 8 that has been press-packed into the through-hole 5 is exposed (8b) on the rear side of the substrate 2, it actually protrudes into the escape hole 11 of the covering plate 10. Consequently, the connection between this exposed part 8b and the junction land 4 is perfectly secured and the electrical connections can be protected.

The escape hole 11 of the covering plate 10 should have an inner diameter somewhat larger than that of the through-hole 5.

The mask 13 is formed using a silk screen (e.g., #180-300), but other masks can also be used if they satisfy the condition that no conductive material 8 flows to positions different from those that correspond to the through-hole 5.

Although, in FIG. 1, one through-hole 5 is bored in the printed circuit board 1, the same effect can be achieved by continuously applying the above-described method to a board provided with a plurality of through-holes.

Sample packing conditions governing the use of the packing nozzle 14 are listed below:

Scanning speed of the packing nozzle: 10 mm/s
Thickness of the printed circuit board: 1.6 mm
Through-hole diameter: 0.4 mm
Injection pressure: 6.0 kg/cm$^2$
Viscosity of the conductive material: 1000 cps at 25° C.;

where copper paste with no solvent was used as the conductive material.

After the conductive material 8 is packed under the above conditions, it is dried in an oven heater at 150° C. for 30 minutes to form a conductive circuit in the through-hole 5.

Second Embodiment

Figure 2:
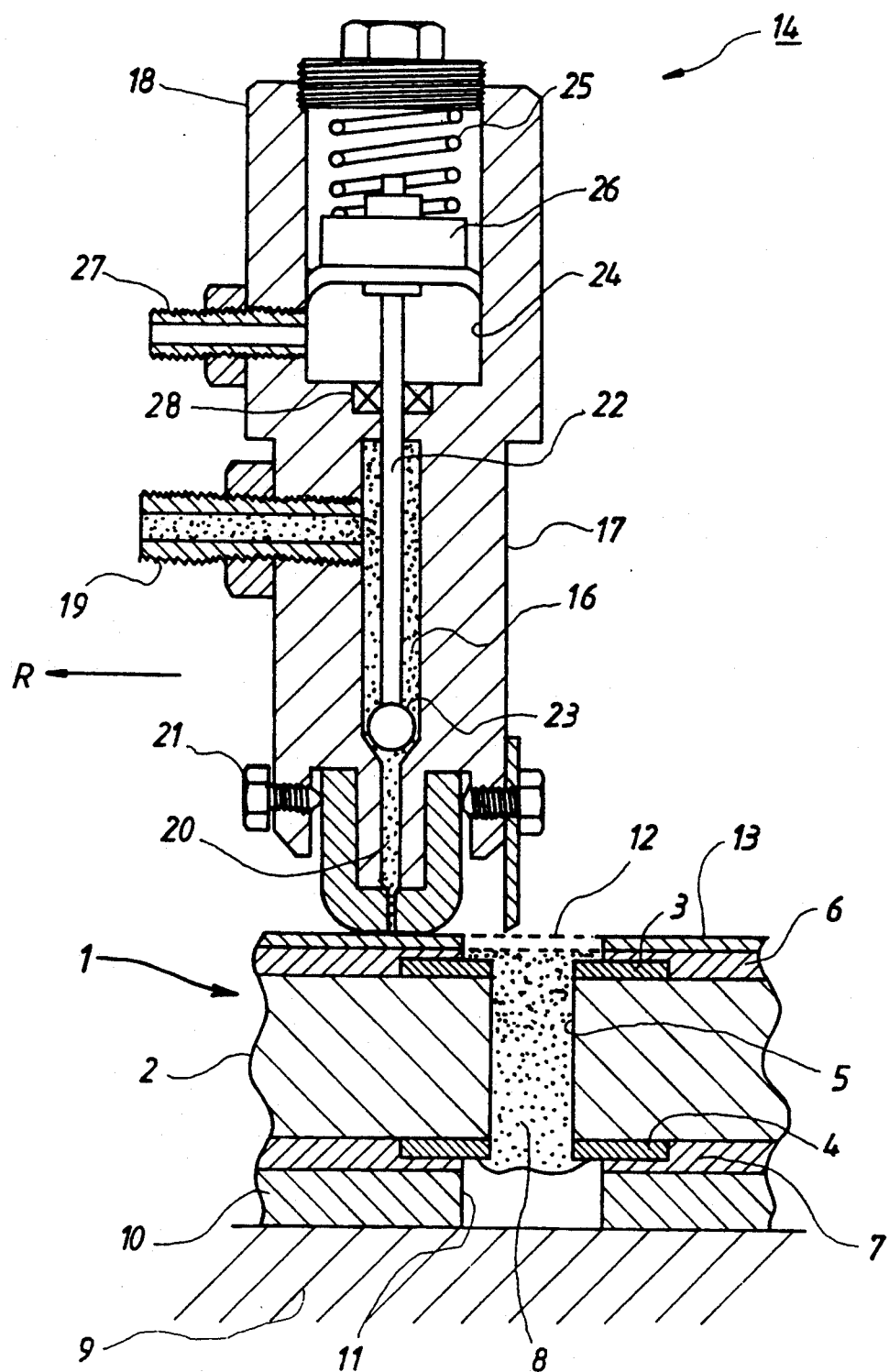

FIG. 2 is a cross-sectional view showing an apparatus for packing filler of conductive material or the like into through-holes in a printed circuit board according to a second embodiment of the present invention.

The second embodiment differs from the first embodiment only in the structure of the packing nozzle. Hence, the parts common to these embodiments in the respective figures are numbered in the same way, and no explanations will be given for these parts and their associated methods.

In the second embodiment, a squeegee 29 is mounted on one side of the nozzle end 15 in the packing nozzle 14 and behind the nozzle 14 in the horizontally advancing direction of the nozzle 14.

Then the squeegee 29 fitted to the nozzle end 15 can sweep away the extra conductive material 8 stuck to the upper side of the through-hole 5 along the packing hole 12 during the course of the horizontal movement of the packing nozzle 14 after conductive material 8 has been packed into the through-hole 5 with the packing nozzle 14.

The nozzle end 15 can be replaced to select the size of a delivery hole 15a by using fitting screws 21, but a plastic or synthetic rubber replacement is preferable to ensure the wear resistance of the surface abutting against the mask 13 and to protect the mask 13. The same applies to the materials for the squeegee 29.

Third Embodiment

Figure 3:
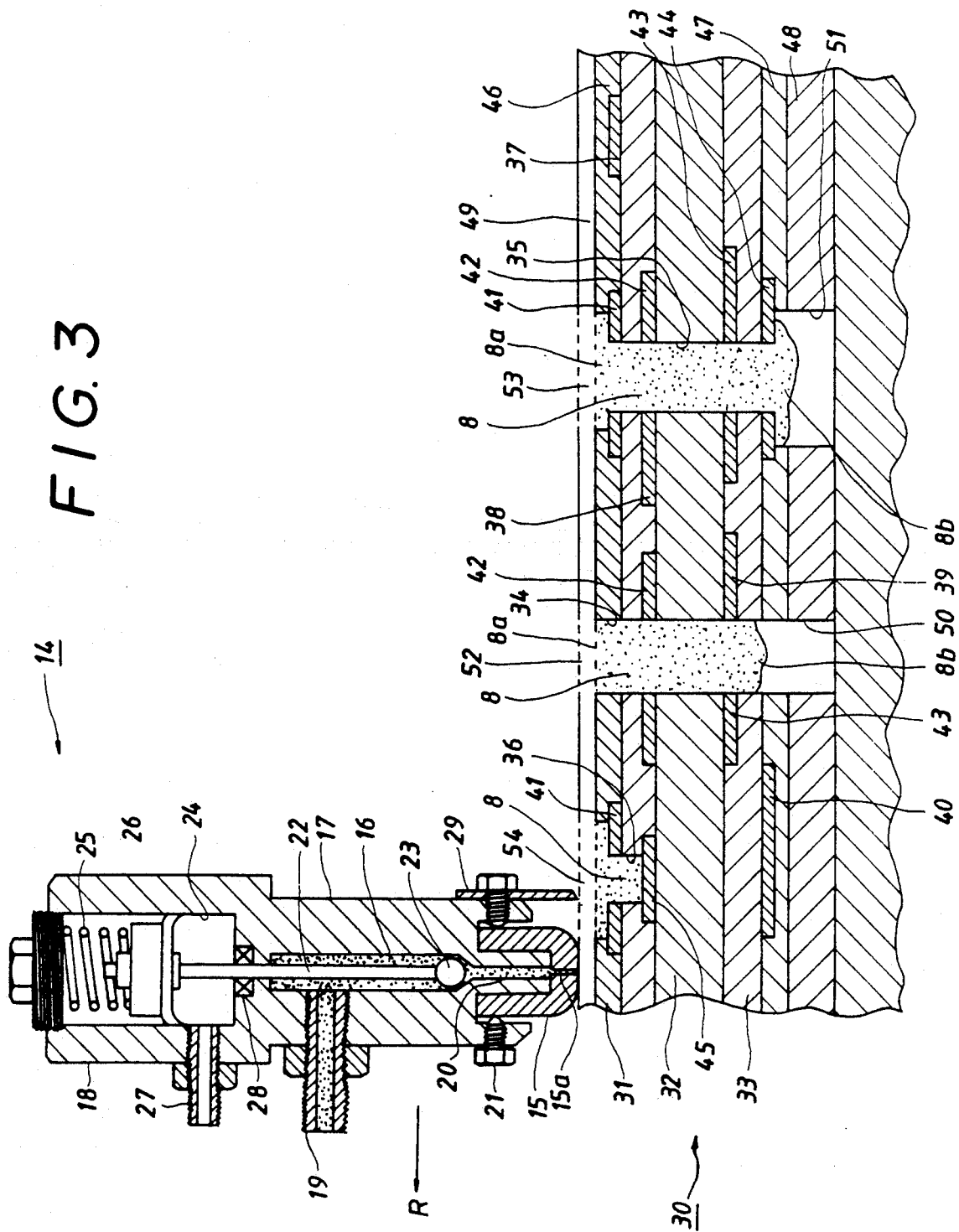

FIG. 3 is an illustration showing a cross-sectional view of an apparatus for packing filler of conductive material or the like into through-holes in a printed circuit board according to a third embodiment of the present invention.

The apparatus of the third embodiment packs conductive material 8 into through-holes 34 and 35 and a connecting hole 36 on a multi-layered printed circuit board 30 composed of three laminated substrate layers 31, 32, and 33, instead of the through-hole 5 on the printed circuit board 1 of the first embodiment, on both sides of which circuit patterns are formed.

Printed circuits 37, 38, 39, and 40 are arranged on both sides of the respective substrates 31, 32, and 33 of the printed circuit board 30, and the printed circuit boards on the substrates 31, 32, and 33 are provided with junction lands 41, 42, 43, and 44 to connect the circuit patterns on the substrates 31, 32 and 33. The through-holes 34 and 35 are installed to establish electrical connections between the junction lands 42 and 43 and between the junction lands 41, 42, 43 and 44, respectively, on the substrates 31, 32, and 33. The connecting hole 36 is used to electrically connect the junction land 41 of the circuit pattern 37 on the top side of the sustrate 31 with the junction land 45 of the circuit pattern 38 on the bottom side of the sustrate 31.

The substrate 31 on the uppermost side and the substrate 33 on the lowermost side of the printed circuit board 30 are respectively coated with solder resists 46 and 47 so that the resists cover the printed circuit boards 37 and 40.

The through-holes 34 and 35 are produced by punching or drilling, and the connecting hole 36 is bored by drilling.

The packing process for packing conductive material 8 into the through-hole 34 and 35 and the connecting hole 36 of the above-described printed board 30 is carried out using a method, similar to that described for the first embodiment, according to which the top side of a frame 9 is overlaid with a covering plate 48, the printed board 30, and a mask 49. Then, as in the first embodiment, the packing nozzle 14 is horizontally shifted from the through-hole 35 toward the connecting hole 36 to pack conductive material 8 into the through-holes 34 and 35 and the connecting hole 36 through the mask 49.

The covering plate 48 and mask 49 are provided with escape holes 50 and 51 and packing through-holes 52, 53, and 54 at the positions corresponding to the through-holes 34 and 35 and the connecting hole 36, and are set in the manner to secure the above positional correspondence.

As in the second embodiment, the packing nozzle 14 is fitted with a squeegee (29). Hence, conductive material 8 is packed into the through-holes 34 and 35 and the connecting hole 36 through packing through-holes 52, 53, and 54 while removing surplus conductive material 8.

The above description has been applied to an apparatus for packing filler of conductive material. As for other filler, such as embedding filler, the above description is also valid for all the embodiments.

In the first through the third embodiments, conductive material 8 is packed into the through-holes 5, 34, and 35 and the connecting hole 36 through packing through-holes 12, 52, 53, and 54 in the mask 13 or 49 by means of the packing nozzle 14 using compressed air pressure. For this reason, packing of small-diameter holes is made possible by adjusting the conditions of pressurized packing without being affected by the fluidity of the filler or the thickness of the substrates, thereby realizing high-density circuits.

Furthermore, the present invention provides the capability to pack the filler without being affected by the fluidity of the filler and eliminates the need to add a solvent to the conductive material. Thereby, the present invention avoids the problems associated with adding a solvent. In other words, non-solvent packing can be accomplished by pressurizing the packing nozzle.

The replaceability of the nozzle end 15 in the packing nozzle 14 allows uniform and stable pressurized packing to be performed in accordance with the delivery conditions of the filler, the diameter of the through-hole, or the board thickness.

Packing through a mask prevents filler from sticking to undesirable places, and continuous packing into those places that correspond to the circuit design of a printed circuit board enhances the packing performance.

What is claimed is:

1. An apparatus for packing filler of conductive material into through-holes or the like in a printed circuit board, comprising:

a packing nozzle having a packing means for delivering filler of conductive material or the like through a delivery opening integrated with said packing means, a delivery valve mounted to said delivery opening, a manipulating means on the upper part of said nozzle for manipulating said delivery valve, and a nozzle tip attachable to and detachable from said delivery opening;

a mask having packing holes disposed in positions corresponding to those of through-holes on said printed circuit board, said mask being mountable on the upper side of said printed circuit board; and a covering plate having escape holes in positions corresponding to those of through-holes on said printed circuit board, said covering plate being disposable on the lower side of said printed circuit board.

2. An apparatus for packing filler of conductive material into through-holes or the like in a printed circuit board, comprising:

a packing nozzle having a packing means for delivering filler of conductive material or the like through a delivery opening integrated with said packing means, a delivery valve mounted to said delivery opening, a manipulating means on the upper part of said nozzle for manipulating said delivery valve, a nozzle tip attachable to and detachable from said delivery opening, and a squeegee disposed on the lower part of said nozzle;

a mask having packing holes disposed in positions corresponding to those of through-holes on said printed circuit board, said mask being mountable on the upper side of said printed circuit board; and a covering plate having escape holes in positions corresponding to those of through-holes on said printed circuit board, said covering plate being disposable on the lower side of said printed circuit board.

3. An apparatus for packing filler into through-holes and the like in a printed circuit board, comprising:

packing means including a nozzle for delivering pressurized filler through the nozzle into through-holes and the like in a printed circuit board; valving means for valving the delivery of the pressurized filler through the nozzle; and manipulating means for manipulating the valving means to control the delivery of the pressurized filler.

4. An apparatus for packing filler according to claim 3; further comprising a nozzle tip attachable to the nozzle for controlling a flow diameter of the pressurized filler.

5. An apparatus for packing filler according to claim 3; further comprising a mask having packing through-holes disposed at positions corresponding to the through-holes and the like in the printed circuit board, and mountable on the printed circuit board at a position opposite the nozzle.

6. An apparatus for packing filler according to claim 3; further comprising a covering plate having escape holes disposed at positions corresponding to the through-holes and the like in the printed circuit board, and disposable below the printed circuit board.

7. An apparatus for packing filler according to claim 3; further comprising controlling means for controlling the manipulating means to control the delivery of the pressurized filler into the through-holes and the like in the substrate.

8. An apparatus for packing filler according to claim 7; wherein the controlling means includes pneumatic controlling means for pneumatically controlling the manipulating means.

9. An apparatus for packing filler according to claim 3; wherein the filler comprises a conductive filler.

10. An apparatus for packing filler according to claim 3; including means mounting the packing means for scanning movement across the substrate to position the nozzle directly over the through-holes and the like in the printed circuit board.

11. An apparatus for packing fill according to claim 10; further comprising a squeegee disposed on the nozzle and effective to remove excess filler during the scanning of the packing means.

* * * * *